«12» United States Patent
Abbott et al.

(10) Patent No.: US 9,853,624 B2
(45) Date of Patent: Dec. 26, 2017

(54) SAW RESONATOR WITH RESONANT CAVITIES

(71) Applicant: RF Micro Devices, Inc., Greensboro, NC (US)

(72) Inventors: Benjamin P. Abbott, Longwood, FL (US); Yiliu Wang, Apopka, FL (US)

(73) Assignee: Qorvo US, Inc., Greensboro, NC (US)

( * ) Notice: Subject to any disclaimer, the term of this patent is extended or adjusted under 35 U.S.C. 154(b) by 89 days.

(21) Appl. No.: 14/939,751

(22) Filed: Nov. 12, 2015

(65) Prior Publication Data

US 2016/0380614 A1 Dec. 29, 2016

Related U.S. Application Data

(60) Provisional application No. 62/184,958, filed on Jun. 26, 2015.

(51) Int. Cl.
| | |
|---|---|
| *H03H 9/25* | (2006.01) |
| *H03H 9/64* | (2006.01) |
| *H03H 9/02* | (2006.01) |
| *H03H 9/145* | (2006.01) |

(52) U.S. Cl.
CPC .... *H03H 9/02818* (2013.01); *H03H 9/14582* (2013.01); *H03H 9/25* (2013.01); *H03H 9/6433* (2013.01); *H03H 9/6496* (2013.01)

(58) Field of Classification Search
CPC ........... H03H 9/02818; H03H 9/14529; H03H 9/14535; H03H 9/14582; H03H 9/25; H03H 9/64; H03H 6/6489; H03H 9/6496
USPC .................... 333/193–195; 310/313 B, 313 D
See application file for complete search history.

(56) References Cited

U.S. PATENT DOCUMENTS

| | | | | |
|---|---|---|---|---|
| 5,589,806 A | * | 12/1996 | Taguchi | H03H 9/6483 310/313 R |
| 6,326,864 B1 | * | 12/2001 | Takamine | H03H 9/6483 333/133 |
| 6,420,946 B1 | | 7/2002 | Bauer et al. | |
| 6,465,930 B1 | * | 10/2002 | Wright | H03H 9/14505 310/313 B |

(Continued)

OTHER PUBLICATIONS

Ebata, Yasuo, "Suppression of Bulk-Scattering Loss in Saw Resonator with Quasi-Constant Acoustic Reflection Periodicity," 1988 Ultrasonics Symposium, 1988, IEEE, pp. 91-96.

*Primary Examiner* — Barbara Summons
(74) *Attorney, Agent, or Firm* — Withrow & Terranova, P.L.L.C.

(57) ABSTRACT

A surface acoustic wave (SAW) resonator is provided with reduced rattling at frequencies lower than the resonance value. The SAW resonator includes an interdigital transducer (IDT) on a piezoelectric substrate. The IDT includes a first set of interdigital electrodes distributed between and parallel to the first end of the IDT and the second end of the IDT and a second set of interdigital electrodes interleaved with the first plurality of interdigital electrodes. A first resonant cavity is formed a predetermined distance from the first end of the IDT, and a second resonant cavity is formed a predetermined distance from the second end of the IDT. Additionally, a radio frequency (RF) filter is provided that includes multiple SAW resonators that include the resonant cavities formed a predetermined distance from the first and second ends of the IDT. This RF filter may provide increased bandwidth and reduced insertion loss.

11 Claims, 12 Drawing Sheets

(56) References Cited

U.S. PATENT DOCUMENTS

| | | | | |
|---|---|---|---|---|
| 6,677,835 B2 * | 1/2004 | Noguchi | ............... | H03H 9/6483 |
| | | | | 333/193 |
| 6,946,932 B2 | 9/2005 | Takagi et al. | | |
| 7,042,132 B2 | 5/2006 | Bauer et al. | | |
| 7,679,474 B2 | 3/2010 | Igaki et al. | | |
| 7,808,935 B2 * | 10/2010 | Koga | ....................... | H01P 1/213 |
| | | | | 333/132 |
| 8,358,177 B2 * | 1/2013 | Yamanaka | ......... | H03H 9/02551 |
| | | | | 310/313 B |
| 2012/0188026 A1 * | 7/2012 | Yamaji | ............... | H03H 9/14535 |
| | | | | 333/133 |

* cited by examiner

SAW RESONATOR WITH RESONANT CAVITIES

RELATED APPLICATIONS

This application claims the benefit of provisional patent application Ser. No. 62/184,958, filed Jun. 26, 2015, the disclosure of which is hereby incorporated herein by reference in its entirety.

FIELD OF THE DISCLOSURE

The present disclosure relates to a Surface Acoustic Wave (SAW) resonator.

BACKGROUND

Surface Acoustic Wave (SAW) resonators are used in a variety of different circuitry, and are often found in mobile communication devices. Functionally, SAW resonators exploit the piezoelectric effect of a substrate to induce a mechanical strain in the device via an electrical input signal. The mechanical strain is then used to produce one or more desired electrical output signals. The piezoelectric effect is an interaction between the mechanical and electric properties of the substrate of the SAW resonator, which is usually a crystal with a high affinity for piezoelectric activity. When mechanical strain is induced in the crystal, an electric potential is produced and vice versa. Many SAW resonators use Interdigital Transducers (IDTs) to convert electrical signals into acoustic waves, and acoustic waves back into electrical signals. An input signal (e.g., a sinusuoidal input signal) provided to an IDT creates an alternating polarity between a set of interdigital electrodes, or fingers, of the IDT. Due to the piezoelectric properties of the substrate described above, the alternating polarity between the interdigital electrodes of the IDT creates a mechanical wave at the surface (i.e., a surface acoustic wave). The mechanical wave will generally propagate to another set of interdigital electrodes of the same or a different IDT, where it will cause a desired electrical signal to be produced.

FIG. 1 illustrates a conventional one-port SAW resonator 10. The SAW resonator 10 includes an IDT on the piezoelectric substrate 12. The IDT includes a first plurality of interdigital electrodes 14 connected to an input port IN and a second plurality of interdigital electrodes 16 connected to an output port OUT. In some SAW resonators, an acoustic mirror or reflector is added to prevent interference patterns or reduce insertion losses. In the SAW resonator 10 of FIG. 1, a first reflector 18 is located on the piezoelectric substrate at a first end of the IDT. Additionally, a second reflector 20 is located on the piezoelectric substrate at a second end of the IDT. The first reflector 18 and the second reflector 20 reflect the surface acoustic wave and generate a standing wave between the two reflectors.

FIG. 2 is a graph showing the admittance, conductance, and passband of the SAW resonator 10 shown in FIG. 1. The admittance and conductance values shown in the graph illustrate a resonance value of the SAW resonator 10, which is shown by the peak in the admittance and conductance.

However, the graph also shows some oscillations in the conductance of the SAW resonator 10 at frequencies lower than the resonance value. These oscillations are often referred to as rattling. This rattling may reduce the quality factor of the SAW resonator 10 as discussed below and therefore reduce the performance thereof.

FIG. 3 illustrates a Bode Q plot showing the quality factor (or Q factor) of the SAW resonator 10 shown in FIG. 1. The quality factor of a resonator is a dimensionless parameter that describes how under-damped the resonator is, as well as characterizes the bandwidth of the resonator relative to its center frequency. As shown in FIG. 3, the quality factor is fairly smooth above the resonance value of the SAW resonator 10, however, the rattling discussed above with respect to FIG. 2 is visible at frequencies lower than the resonance value. This rattling causes inefficiencies in the operation of the SAW resonator 10 and leads to losses in the bandwidth of the SAW resonator 10.

Accordingly, improved SAW resonators are needed with reduced rattling at frequencies lower than the resonance value.

SUMMARY

A surface acoustic wave (SAW) resonator is provided with reduced rattling at frequencies lower than a resonance value. The SAW resonator includes an interdigital transducer (IDT) on a piezoelectric substrate. The IDT includes a first set of interdigital electrodes distributed between and parallel to a first end of the IDT and a second end of the IDT and a second set of interdigital electrodes interleaved with the first set of interdigital electrodes. A first resonant cavity is formed a predetermined distance from the first end of the IDT wherein at least a first one of the first set of interdigital electrodes and at least a first one of the second set of interdigital electrodes is between the first end of the IDT and the first resonant cavity.

The interdigital electrodes of the first resonant cavity have a different electrode periodicity than at least a first one of the first set of interdigital electrodes and at least the first one of the second set of interdigital electrodes between the first end of the IDT and the first resonant cavity. A second resonant cavity is formed a predetermined distance from the second end of the IDT wherein at least a last one of the first set of interdigital electrodes and at least a last one of the second set of interdigital electrodes is between the second end of the IDT and the second resonant cavity. The interdigital electrodes of the second resonant cavity have a different electrode periodicity than at least the last one of the first set of interdigital electrodes and at least the last one of the second set of interdigital electrodes between the second end of the IDT and the second resonant cavity.

Additionally, a radio frequency (RF) filter is provided that includes multiple SAW resonators that include the resonant cavities formed a predetermined distance from the first and second ends of the IDT. This RF filter may provide increased bandwidth and reduced insertion loss.

In some embodiments, a first subset of electrodes of the first set of interdigital electrodes and the second set of interdigital electrodes at the first end of the IDT have a first electrode periodicity. A second subset of electrodes of the first set of interdigital electrodes and the second set of interdigital electrodes at or near a center of the IDT have a second electrode periodicity. The first resonant cavity includes of a third subset of electrodes of the first set of interdigital electrodes and the second set of interdigital electrodes between the first subset of electrodes and the second subset of electrodes and has a third electrode periodicity wherein the third electrode periodicity is less than the first electrode periodicity and less than the second electrode periodicity.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

A surface acoustic wave (SAW) resonator is provided with reduced rattling at frequencies lower than the resonance value. The SAW resonator includes an interdigital transducer (IDT) on a piezoelectric substrate. The IDT includes a first set of interdigital electrodes distributed between and parallel to a first end of the IDT and a second end of the IDT and a second set of interdigital electrodes interleaved with the first plurality of interdigital electrodes. A first resonant cavity is formed a predetermined distance from the first end of the IDT wherein at least a first one of the first set of interdigital electrodes and at least a first one of the second set of interdigital electrodes is between the first end of the IDT and the first resonant cavity. A second resonant cavity is formed a predetermined distance from the second end of the IDT wherein at least a last one of the first set of interdigital electrodes and at least a last one of the second set of interdigital electrodes is between the second end of the IDT and the second resonant cavity.

Figure 4:
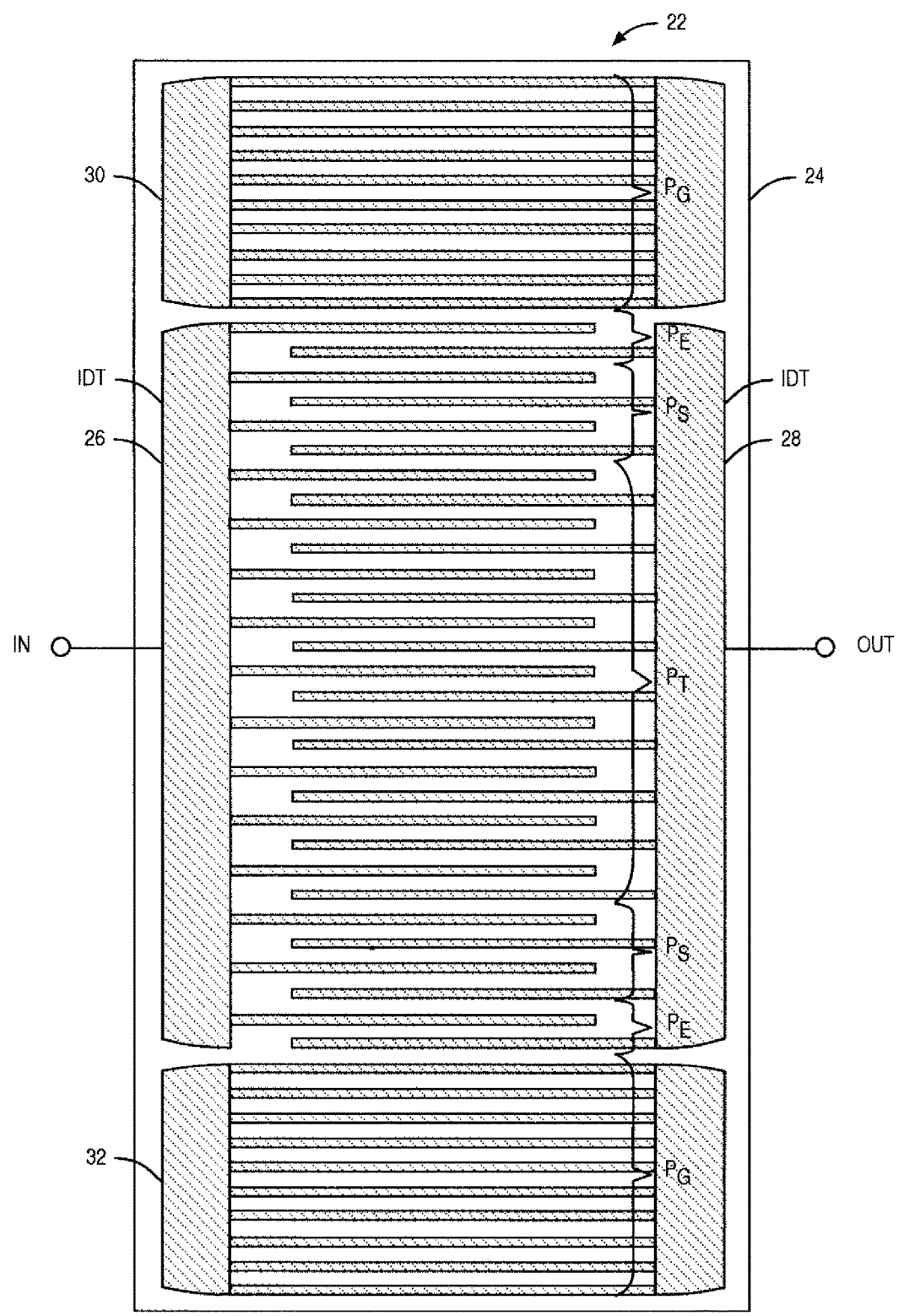
FIG. 4 illustrates a SAW resonator with resonant cavities.

As such, FIG. 4 illustrates a SAW resonator 22 with resonant cavities. The SAW resonator 22 includes an IDT on the piezoelectric substrate 24. The IDT includes a first set of interdigital electrodes 26 connected to an input port IN and a second set of interdigital electrodes 28 connected to an output port OUT. In some SAW resonators, a mechanical absorber or reflector is added to prevent interference patterns or reduce insertion losses. In the SAW resonator 22 of FIG. 4, a first reflector 30 is located on the piezoelectric substrate at the first end of the IDT. Additionally, a second reflector 32 is located on the piezoelectric substrate at the second end of the IDT.

In some embodiments, a first subset of electrodes of the first set of interdigital electrodes 26 and the second set of interdigital electrodes 28 at the first end of the IDT has a first electrode periodicity, shown as $P_E$ (the subscript E refers to the end of the IDT). As used herein, an electrode periodicity is the space between respective electrodes. A second subset of electrodes of the first set of interdigital electrodes 26 and the second set of interdigital electrodes 28 at or near a center of the IDT has a second electrode periodicity, shown as $P_T$ (the subscript T refers to the transducer of the IDT).

The first resonant cavity includes a third subset of electrodes of the first set of interdigital electrodes 26 and the second set of interdigital electrodes 28 between the first subset of electrodes and the second subset of electrodes and has a third electrode periodicity, shown as $P_S$ (the subscript S refers to the cavity also being known as a spacer). The third electrode periodicity $P_S$ is less than the first electrode periodicity $P_E$ and less than the second electrode periodicity $P_T$. Additionally, the electrode periodicity of the first reflector 30 and the second reflector 32 is shown as $P_G$ (the subscript G refers to the reflector also being known as a grating).

Figure 5A:
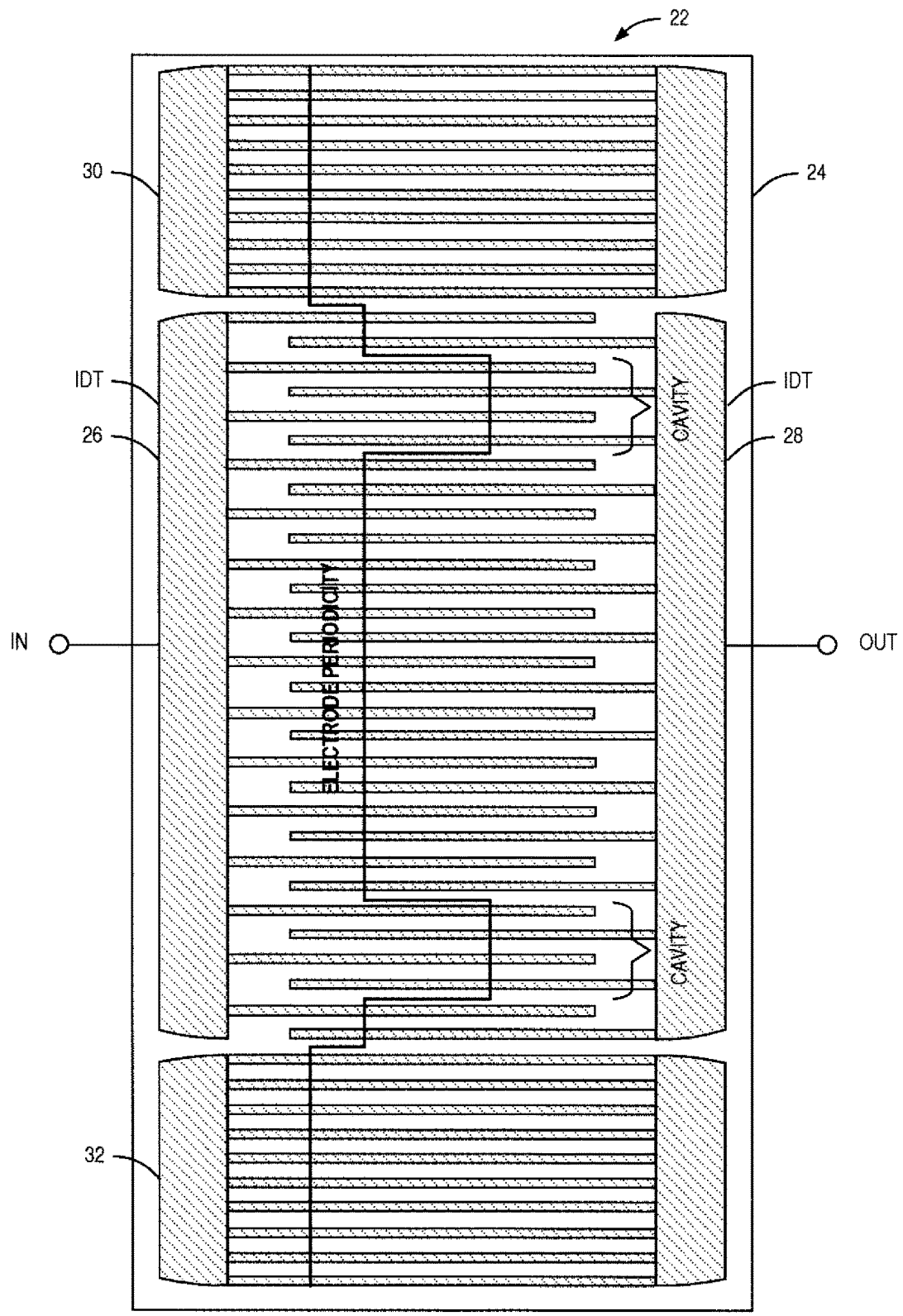
FIGS. 5A and 5B illustrate SAW resonators with resonant cavities having different electrode periodicities.
Figure 5B:
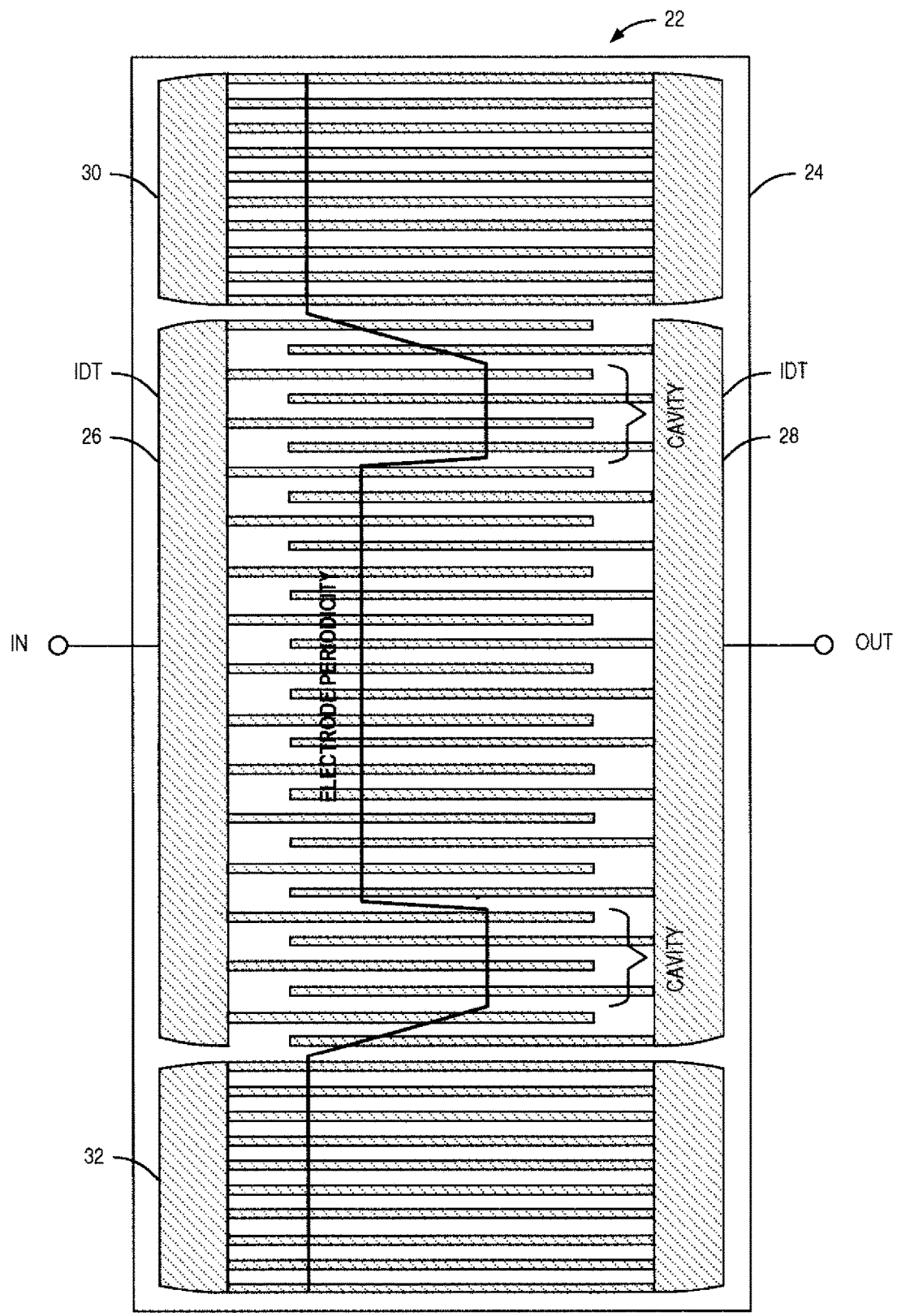

FIGS. 5A and 5B illustrate the SAW resonator 22 shown in FIG. 4 with resonant cavities having different electrode periodicities. Specifically, FIG. 5A shows a SAW resonator 22 where the cavity is formed by the third electrode periodicity $P_S$ being less than the first and second electrode periodicities $P_E$ and $P_T$. In this example, the first and second electrode periodicities $P_E$ and $P_T$ are shown as being equal to each other. Also, the transitions between the different electrode periodicities are abrupt. The current disclosure is not limited thereto. FIG. 5B again shows a SAW resonator 22 where the cavity is formed by the third electrode periodicity $P_S$ being less than the first and second electrode periodicities $P_E$ and $P_T$. In this example, however, the first and second electrode periodicities $P_E$ and $P_T$ are shown as not being equal to each other. Also, the transitions between the different electrode periodicities are not abrupt. Instead, the electrode periodicities may vary. In FIG. 5B, the first electrode periodicity $P_E$ varies linearly from the end of the IDT to the start of the cavity. Likewise, the transition from the electrode periodicity of the cavity to the second electrode periodicity $P_T$ may also vary. While these variations are shown as linear variations in FIG. 5B, the current disclosure is not limited thereto.

Figure 6:
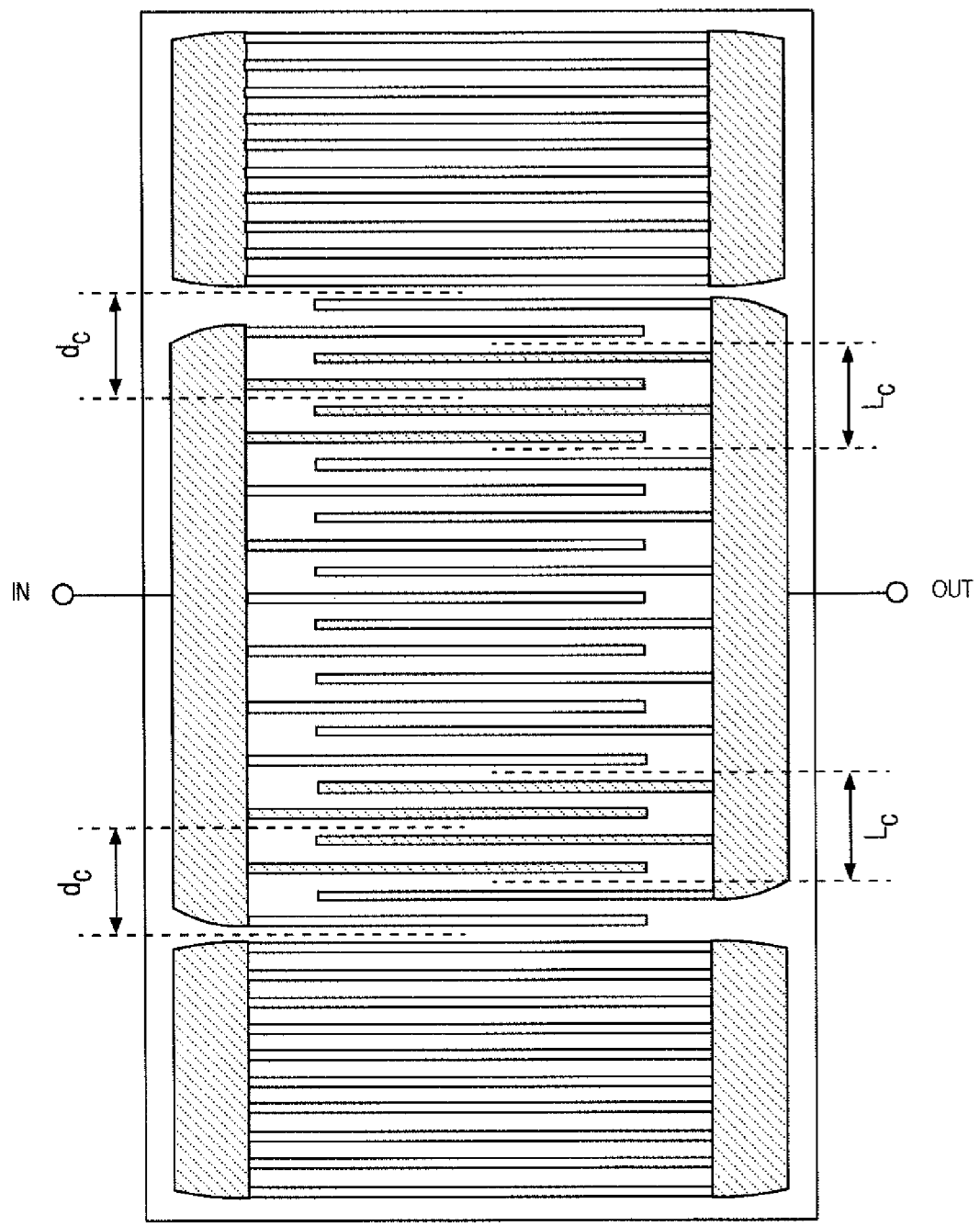
FIG. 6 illustrates the placement of resonant cavities in a SAW resonator.

These resonant cavities reduce the rattling of the Q factor between a low value and a high value below the resonant frequency of the SAW resonator 22. This is due to proper adjustment of the size and placement of the resonant cavities. Due to the concentration of acoustic energy inside the resonance cavities, having the resonance cavity inside the IDT also improves the transduction process. In some embodiments, the phase shift of the resonant cavities is adjusted to tune the frequencies of the spurious resonances to coincide with the valleys between the rolling hills of the IDT's transduction response. FIG. 6 illustrates the placement of resonant cavities in a SAW resonator. The resonant cavities are located near, but not at, the end of the IDT. The distance between the end of the IDT and the center of the resonant cavity is shown as $d_C$. The size or length of the resonant cavity is shown as $L_C$.

If the wavelength of the IDT is $\lambda_{IDT}$, a typical length for a resonant cavity may be $L_C=N*\lambda_{IDT}+\Delta L$. $\Delta L$ is a very small, optional adjustment and may be around $-0.05*\lambda_{IDT}$. Similarly, the location of the resonant cavity can also be given in terms of how many IDT wavelengths $\lambda_{IDT}$ the center is away from the end of the IDT.

Figure 1:
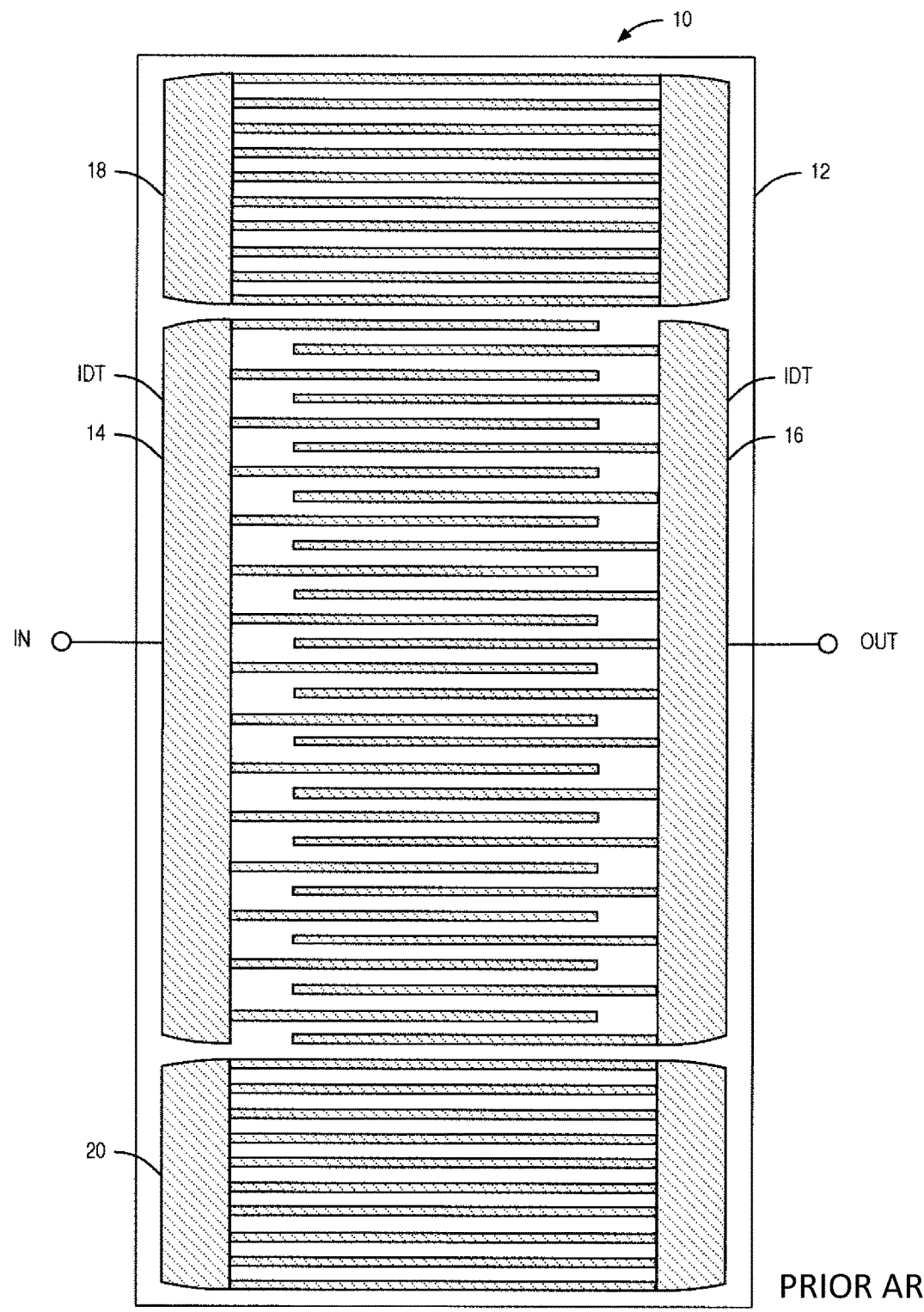
FIG. 1 illustrates a conventional one-port Surface Acoustic Wave (SAW) resonator.
Figure 2:
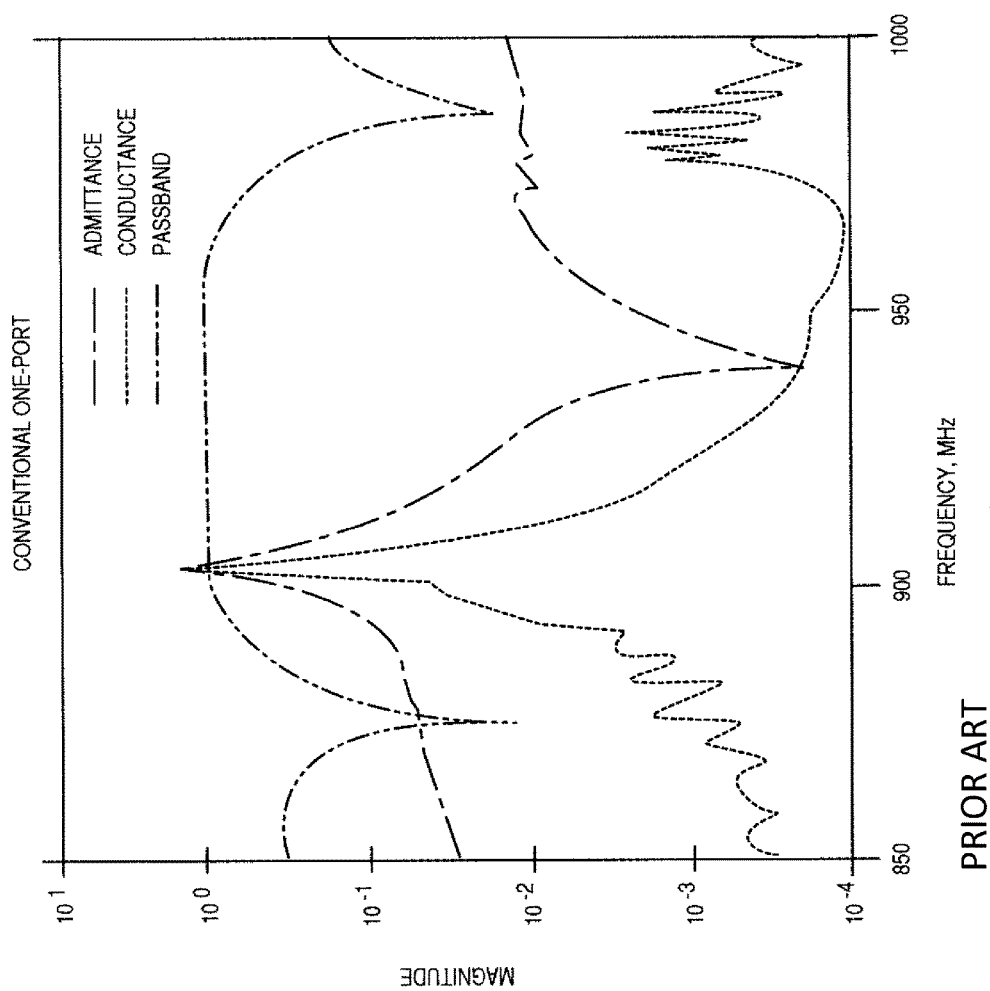
FIG. 2 illustrates the admittance, conductance, and passband of a conventional one-port SAW resonator as in FIG. 1.
Figure 3:
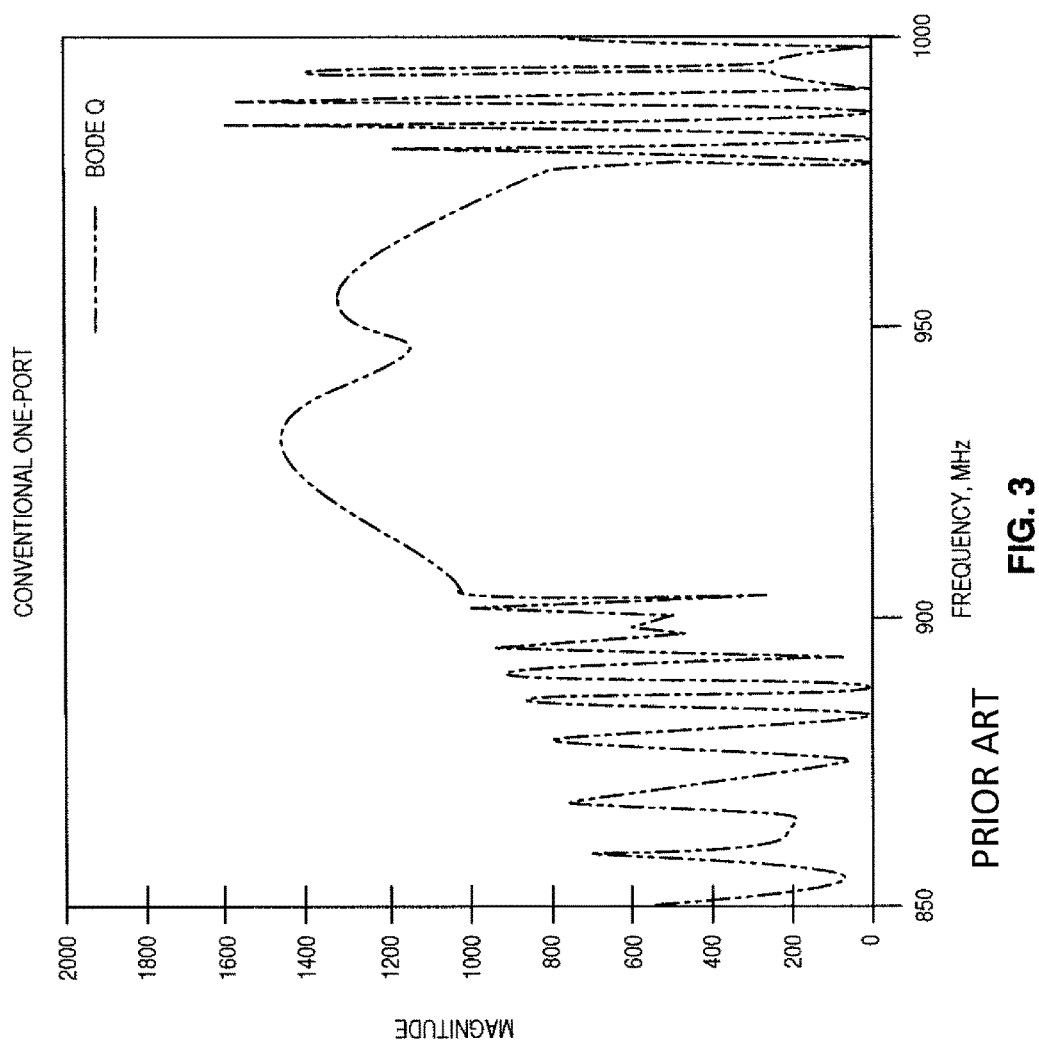
FIG. 3 illustrates a Bode Q plot for a conventional one-port SAW resonator as in FIG. 1.
Figure 7:
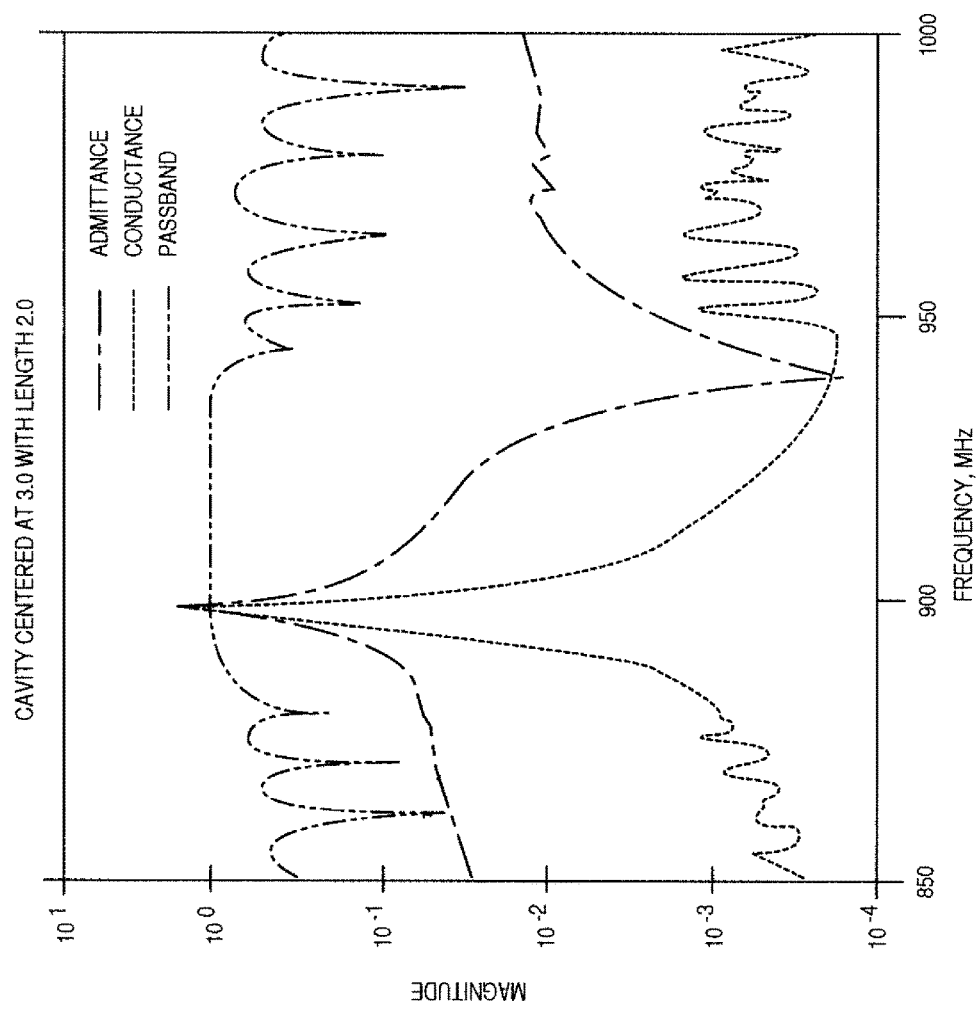
FIG. 7 illustrates the admittance, conductance, and passband of a SAW resonator with a cavity centered at 3.0 interdigital transducer (IDT) wavelengths from the end of the IDT with a length of 2.0.
Figure 8:
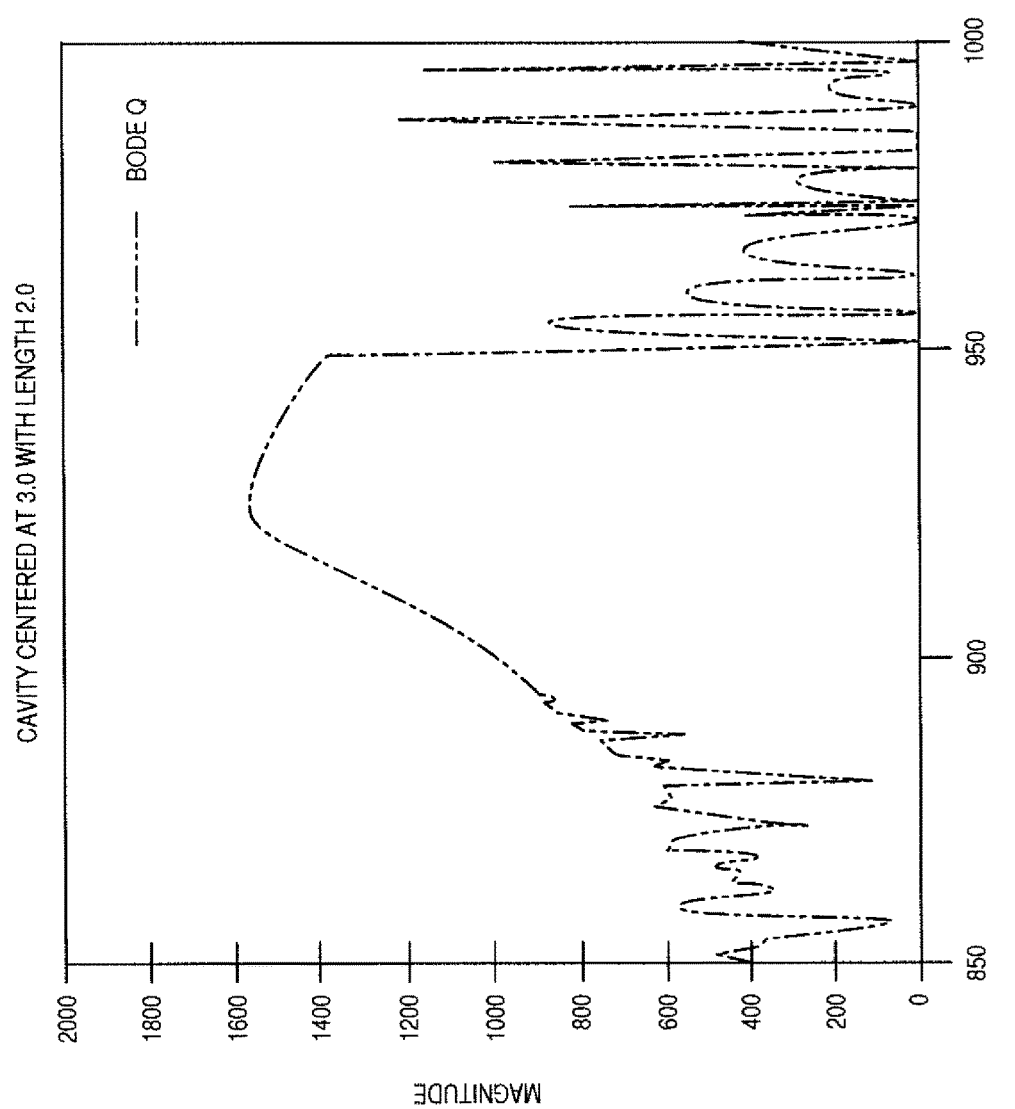
FIG. 8 illustrates a Bode Q plot for a SAW resonator with a cavity centered at 3.0 IDT wavelengths from the end of the IDT with a length of 2.0.

FIG. 7 illustrates the admittance, conductance, and passband of a SAW resonator with a cavity centered at $3.0*\lambda_{IDT}$ from the end of the IDT with a length of $2.0*\lambda_{IDT}$. The resonance value of this SAW resonator 22 is shown by the peak in the admittance and conductance. Note that the oscillations in the conductance of the SAW resonator 22 at frequencies lower than the resonance value are greatly reduced compared to the plot for the similar SAW resonator 10 in FIG. 2. The Q factor of a resonator is a dimensionless parameter that describes how under-damped the resonator is, as well as characterizes the bandwidth of the resonator relative to its center frequency. More specifically, the quality factor is defined as $2\pi*$(Energy stored)/(Energy dissipated per cycle). FIG. 8 illustrates a Bode Q plot showing the quality factor (or Q factor) of the SAW resonator 22 with the resonant cavities. The Q factor at frequencies lower than the resonance value is now much smoother compared to the plot for the similar SAW resonator 10 in FIG. 3. This reduced rattling leads to increased efficiency in the operation of the SAW resonator 22 and leads to reduced losses in the bandwidth of the SAW resonator 22 with resonant cavities compared to the SAW resonator 10 without such resonant cavities.

Figure 9:
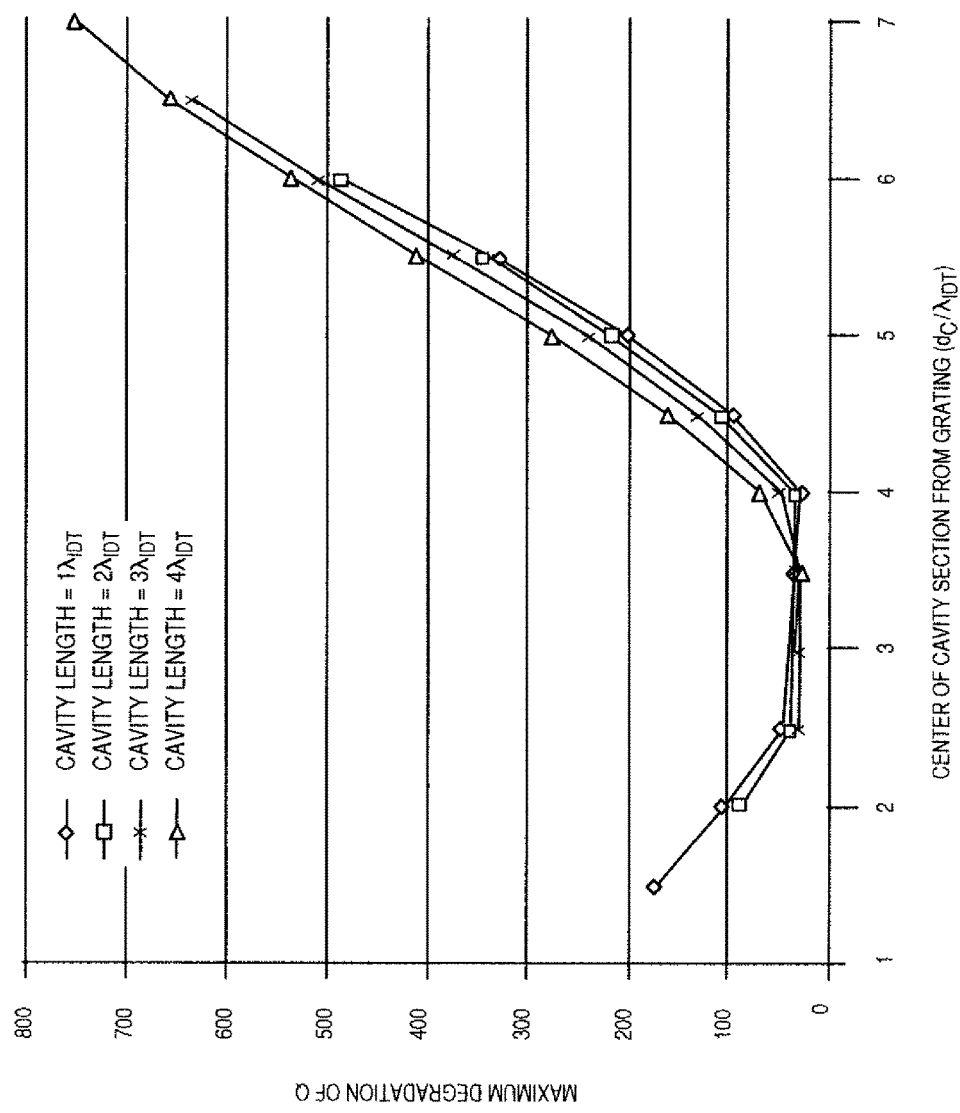
FIG. 9 illustrates a plot of the maximum degradation of Q for various cavity geometries.
Figure 10:
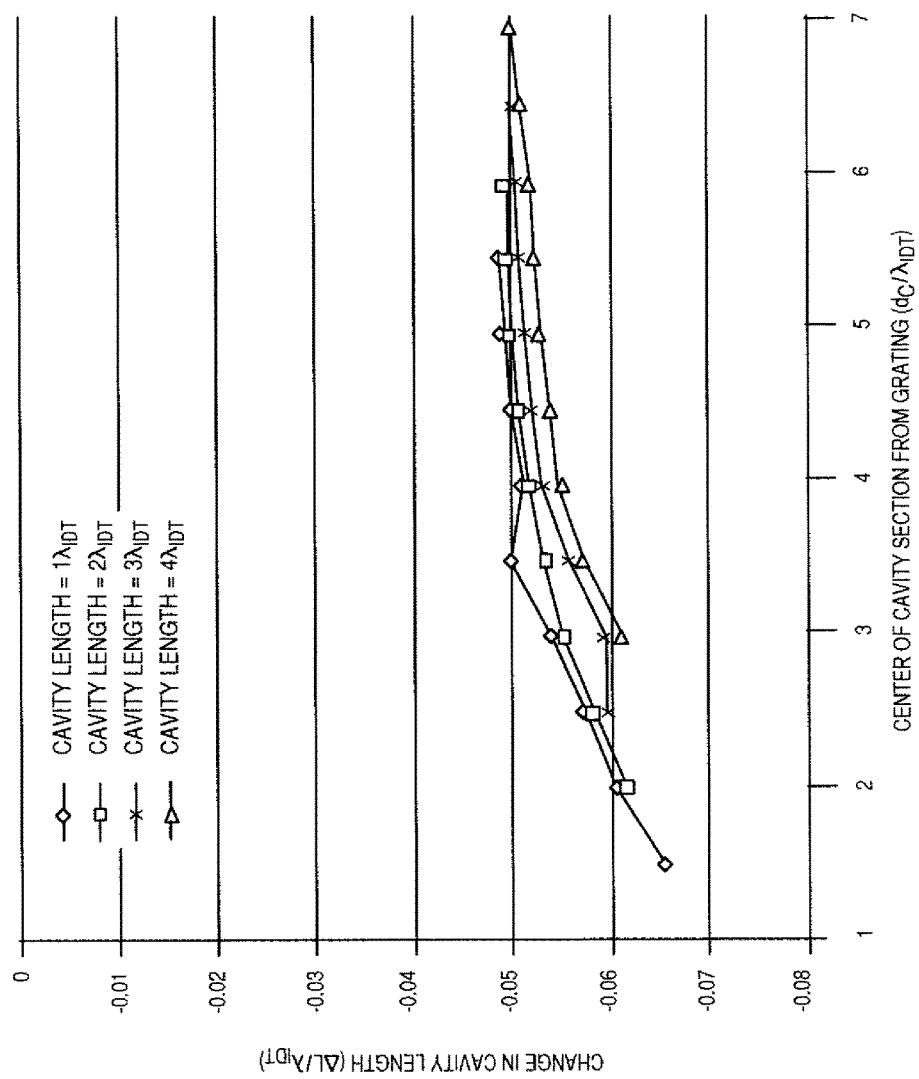
FIG. 10 illustrates a relationship between the change in cavity length and the location of the cavity for various cavity geometries.

As discussed above, the length and location of the resonant cavities can affect various properties of the SAW resonator 22. FIG. 9 illustrates a plot of the maximum degradation of Q for various cavity geometries. Four plots are overlaid where the cavity length $L_C$ is one, two, three, or four $\lambda_{IDT}$ long. In each of these cases, the smallest maximum degradation of Q occurs when the center of the resonant cavity $d_C$ is somewhere between three and four $\lambda_{IDT}$ away from the end of the IDT. Additionally, FIG. 10 illustrates a relationship between the change in resonant cavity length $L_C$ and the location of the resonant cavity $d_C$ for various resonant cavity geometries. As can be seen, AL values between $-0.05*\lambda_{IDT}$ and $-0.07*\lambda_{IDT}$ are acceptable for various resonant cavity lengths $L_C$.

By using a SAW resonator with resonant cavities, the rattling can be reduced. This increases the efficiency of the SAW resonator and reduces losses in the bandwidth of the SAW resonator. Such a SAW resonator can be used in several places in an RF transmitter to increase the performance of the RF transmitter.

Figure 11:
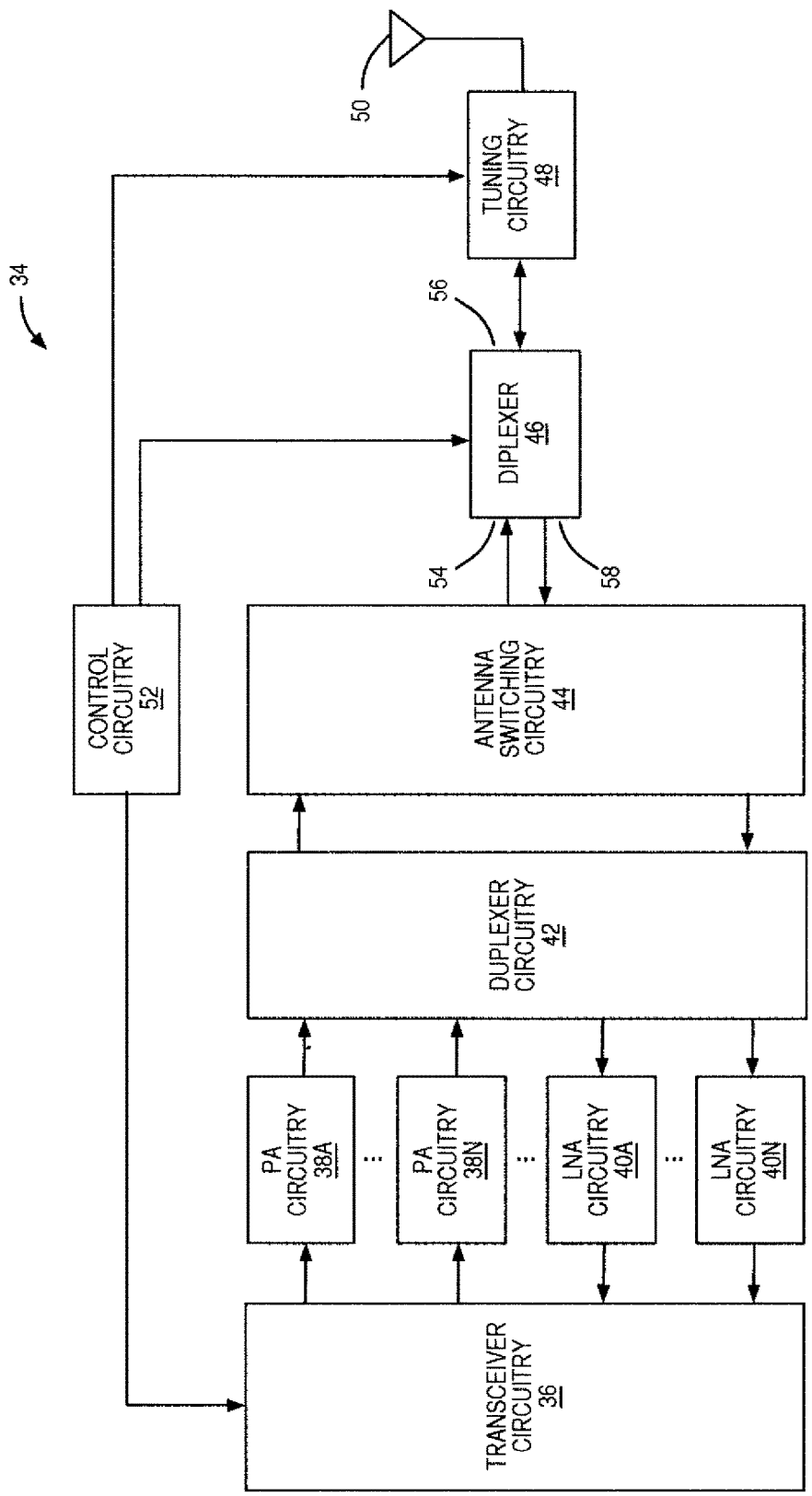
FIG. 11 is a schematic representation of RF front end circuitry according to some embodiments of the present disclosure using at least one SAW resonator with resonant cavities.

FIG. 11 is a schematic representation of RF front end circuitry 34 according to some embodiments of the present disclosure using at least one SAW resonator 22 with resonant cavities. For example, the RF front end circuitry 34 shown in FIG. 11 can function as either an RF transmitter or an RF receiver. When transmitting, transceiver circuitry 36 will modulate a carrier signal. The carrier signal will pass through one or more of a plurality of power amplifiers 38A-38N, where it will be amplified and delivered through duplexer circuitry 42 to antenna switching circuitry 44. The antenna switching circuitry 44 will place one or more output terminals of the plurality of power amplifiers 38A-38N in communication with a low band port 54 of a diplexer 46. As the carrier signal is passed through the diplexer 46, the carrier signal is filtered by a low pass filter. Accordingly, the signal at an antenna port 56 of the diplexer is virtually free of components that fall within the high pass band, thereby preventing signal leakage back from the antenna port 56 to a high band port 58 of the diplexer 46. By preventing signal leakage from the antenna port 56 to the high band port 58 during transmission of a signal, desensitization of the receive circuitry is avoided, and the signal passed to an antenna 50 through antenna tuning circuitry 48 is virtually free of harmonic distortion as a result of the antenna switching circuitry 44. The RF front end circuitry 34 is controlled by control circuitry 52.

When receiving, the RF front end circuitry 34 performs a similar process but in reverse. Although, while the transmitted signal passed through one or more of the plurality of power amplifiers 38A-38N, where it was amplified and delivered through the duplexer circuitry 42 to the antenna switching circuitry 44, the received signal is delivered through the duplexer circuitry 42 to pass through one or more of a plurality of low-noise amplifiers 40A-40N.

A SAW resonator 22 with resonant cavities can be used in the construction of SAW filters, and the SAW filters can be used in one or more components of RF front end circuitry 34. SAW resonators may also be used in timing or frequency control applications.

Those skilled in the art will recognize improvements and modifications to the preferred embodiments of the present disclosure. All such improvements and modifications are considered within the scope of the concepts disclosed herein and the claims that follow.

What is claimed is:

1. A surface acoustic wave (SAW) resonator comprising:
a piezoelectric substrate; and
an interdigital transducer (IDT) on the piezoelectric substrate comprising:
  a first end;
  a second end;
  a first plurality of interdigital electrodes distributed between and parallel to the first end of the IDT and the second end of the IDT;
  a second plurality of interdigital electrodes interleaved with the first plurality of interdigital electrodes;
  a first resonant cavity formed a predetermined distance from the first end of the IDT wherein at least a first one of the first plurality of interdigital electrodes and at least a first one of the second plurality of interdigital electrodes are between the first end of the IDT and the first resonant cavity, where the interdigital electrodes of the first resonant cavity have a different electrode periodicity than the at least first one of the first set of interdigital electrodes and the at least first one of the second set of interdigital electrodes between the first end of the IDT and the first resonant cavity; and
  a second resonant cavity formed a predetermined distance from the second end of the IDT wherein at least a last one of the first plurality of interdigital electrodes and at least a last one of the second plurality of interdigital electrodes are between the second end of the IDT and the second resonant cavity, where the interdigital electrodes of the second resonant cavity have a different electrode periodicity than the at least last one of the first set of interdigital electrodes and the at least last one of the second set of interdigital electrodes between the second end of the IDT and the second resonant cavity;

where a first subset of electrodes of the first plurality of interdigital electrodes and the second plurality of interdigital electrodes at the first end of the IDT has a first electrode periodicity;

a second subset of electrodes of the first plurality of interdigital electrodes and the second plurality of interdigital electrodes at or near a center of the IDT has a second electrode periodicity;

the first resonant cavity is comprised of a third subset of electrodes of the first plurality of interdigital electrodes and the second plurality of interdigital electrodes between the first subset of electrodes and the second subset of electrodes and has a third electrode periodicity wherein the third electrode periodicity is less than the first electrode periodicity and less than the second electrode periodicity; and the first electrode periodicity is greater than the second electrode periodicity.

2. The SAW resonator of claim 1 wherein the first electrode periodicity varies.

3. The SAW resonator of claim 2 wherein the first electrode periodicity varies linearly.

4. The SAW resonator of claim 1 further comprising:
a first reflector on the piezoelectric substrate located at the first end of the IDT with a fourth electrode periodicity; and
a second reflector on the piezoelectric substrate located at the second end of the IDT.

5. The SAW resonator of claim 4 wherein the fourth electrode periodicity is greater than the second electrode periodicity.

6. The SAW resonator of claim 1 wherein the piezoelectric substrate is Lithium Niobate.

7. A surface acoustic wave (SAW) resonator comprising:
a piezoelectric substrate;
an interdigital transducer (IDT) on the piezoelectric substrate comprising:
a first end;
a second end;
a first plurality of interdigital electrodes distributed between and parallel to the first end of the IDT and the second end of the IDT;
a second plurality of interdigital electrodes interleaved with the first plurality of interdigital electrodes;
a first resonant cavity formed a predetermined distance from the first end of the IDT wherein at least a first one of the first plurality of interdigital electrodes and at least a first one of the second plurality of interdigital electrodes are between the first end of the IDT and the first resonant cavity, where the interdigital electrodes of the first resonant cavity have a different electrode periodicity than the at least first one of the first set of interdigital electrodes and the at least first one of the second set of interdigital electrodes between the first end of the IDT and the first resonant cavity; and
a second resonant cavity formed a predetermined distance from the second end of the IDT wherein at least a last one of the first plurality of interdigital electrodes and at least a last one of the second plurality of interdigital electrodes are between the second end of the IDT and the second resonant cavity, where the interdigital electrodes of the second resonant cavity have a different electrode periodicity than the at least last one of the first set of interdigital electrodes and the at least last one of the second set of interdigital electrodes between the second end of the IDT and the second resonant cavity;
a first reflector on the piezoelectric substrate located at the first end of the IDT with a fourth electrode periodicity; and
a second reflector on the piezoelectric substrate located at the second end of the IDT;
where a first subset of electrodes of the first plurality of interdigital electrodes and the second plurality of interdigital electrodes at the first end of the IDT has a first electrode periodicity;
a second subset of electrodes of the first plurality of interdigital electrodes and the second plurality of interdigital electrodes at or near the center of the IDT has a second electrode periodicity;
the first resonant cavity is comprised of a third subset of electrodes of the first plurality of interdigital electrodes and the second plurality of interdigital electrodes between the first subset of electrodes and the second subset of electrodes and has a third electrode periodicity wherein the third electrode periodicity is less than: the first electrode periodicity, the second electrode periodicity, and the fourth periodicity; and
the first electrode periodicity is approximately equal to the second electrode periodicity,. and the fourth electrode periodicity is greater than both the first electrode periodicity and the second electrode periodicity.

8. A radio frequency (RF) filter comprising:
a plurality of surface acoustic wave (SAW) resonators;
wherein at least one SAW resonator of the plurality of SAW resonators comprises:
a piezoelectric substrate; and
an interdigital transducer (IDT) on the piezoelectric substrate comprising:
a first end of the IDT;
a second end of the IDT;
a first plurality of interdigital electrodes distributed between and parallel to the first end of the IDT and the second end of the IDT;
a second plurality of interdigital electrodes interleaved with the first plurality of interdigital electrodes;
a first resonant cavity formed a predetermined distance from the first end of the IDT wherein at least a first one of the first plurality of interdigital electrodes and at least a first one of the second plurality of interdigital electrodes are between the first end of the IDT and the first resonant cavity, where the interdigital electrodes of the first resonant cavity have a different electrode periodicity than the at least first one of the first set of interdigital electrodes and the at least first one of the second set of interdigital electrodes between the first end of the IDT and the first resonant cavity; and
a second resonant cavity formed a predetermined distance from the second end of the IDT wherein at least a last one of the first plurality of interdigital electrodes and at least a last one of the second plurality of interdigital electrodes are between the second end of the IDT and the second resonant cavity, where the interdigital electrodes of the second resonant cavity have a different electrode periodicity than the at least last one of the first set of interdigital electrodes and the at least last one of the second set of interdigital electrodes between the second end of the IDT and the second resonant cavity;

where a first subset of electrodes of the first plurality of interdigital electrodes and the second plurality of interdigital electrodes at the first end of the IDT has a first electrode periodicity;

a second subset of electrodes of the first plurality of interdigital electrodes and the second plurality of interdigital electrodes at or near a center of the IDT has a second electrode periodicity;

the first resonant cavity of the at least one SAW resonator is comprised of a third subset of electrodes of the first plurality of interdigital electrodes and the second plurality of interdigital electrodes between the first subset of electrodes and the second subset of electrodes and has a third electrode periodicity wherein the third electrode periodicity is less than the first electrode periodicity and less than the second electrode periodicity; and the first electrode periodicity is greater than the second electrode periodicity.

9. The RF filter of claim 8 wherein the first electrode periodicity varies.

10. A radio frequency (RF) transmitter comprising:
modulator circuitry configured to receive a baseband signal and provide an RF input signal;
an amplifier configured to receive and amplify the RF input signal to provide an RF output signal; and
front end circuitry configured to receive the RF output signal and provide the RF output signal to an antenna for transmission comprising at least one RF filter;
wherein the RF filter comprises:
a plurality of surface acoustic wave (SAW) resonators;
wherein at least one SAW resonator of the plurality of SAW resonators comprises:
a piezoelectric substrate;
an interdigital transducer (IDT) on the piezoelectric substrate and comprising:
a first end of the IDT;
a second end of the IDT;
a first plurality of interdigital electrodes distributed between and parallel to the first end of the IDT and the second end of the IDT;
a second plurality of interdigital electrodes interleaved with the first plurality of interdigital electrodes;
a first resonant cavity formed a predetermined distance from the first end of the IDT wherein at least a first one of the first plurality of interdigital electrodes and at least a first one of the second plurality of interdigital electrodes are between the first end of the IDT and the first resonant cavity, where the interdigital electrodes of the first resonant cavity have a different electrode periodicity than the at least first one of the first set of interdigital electrodes and the at least first one of the second set of interdigital electrodes between the first end of the IDT and the first resonant cavity; and
a second resonant cavity formed a predetermined distance from the second end of the IDT wherein at least a last one of the first plurality of interdigital electrodes and at least a last one of the second plurality of interdigital electrodes are between the second end of the IDT and the second resonant cavity, where the interdigital electrodes of the second resonant cavity have a different electrode periodicity than the at least last one of the first set of interdigital electrodes and the at least last one of the second set of interdigital electrodes between the second end of the IDT and the second resonant cavity;
where a first electrode periodicity is greater than a second electrode periodicity.

11. The RF transmitter of claim 10 wherein:
a first subset of electrodes of the first plurality of interdigital electrodes and the second plurality of interdigital electrodes at the first end of the IDT has the first electrode periodicity;
a second subset of electrodes of the first plurality of interdigital electrodes and the second plurality of interdigital electrodes at or near a center of the IDT has the second electrode periodicity; and
the first resonant cavity is comprised of a third subset of electrodes of the first plurality of interdigital electrodes and the second plurality of interdigital electrodes between the first subset of electrodes and the second subset of electrodes and has a third electrode periodicity wherein the third electrode periodicity is less than the first electrode periodicity and less than the second electrode periodicity.

* * * * *

UNITED STATES PATENT AND TRADEMARK OFFICE
CERTIFICATE OF CORRECTION

PATENT NO. : 9,853,624 B2
APPLICATION NO. : 14/939751
DATED : December 26, 2017
INVENTOR(S) : Benjamin P. Abbott and Yiliu Wang Page 1 of 1

It is certified that error appears in the above-identified patent and that said Letters Patent is hereby corrected as shown below:

In the Specification

In Column 5, Line 50, replace "AL values" with --$\Delta L$ values--.

Signed and Sealed this
Twentieth Day of February, 2018

Andrei Iancu
*Director of the United States Patent and Trademark Office*